United States Patent [19]

Gross

[11] Patent Number: 4,528,515

[45] Date of Patent: Jul. 9, 1985

[54] HIGH FREQUENCY DIFFERENTIAL AMPLIFIER WITH ADJUSTABLE DAMPING FACTOR

[75] Inventor: Winthrop A. Gross, Portland, Oreg.

[73] Assignee: Tektronix, Inc., Beaverton, Oreg.

[21] Appl. No.: 464,287

[22] Filed: Feb. 7, 1983

[51] Int. Cl.³ .............................................. H03F 3/45
[52] U.S. Cl. .................................. 330/254; 330/261; 330/311
[58] Field of Search ............... 330/151, 252, 254, 257, 330/260, 261, 311

[56] References Cited

PUBLICATIONS

De Kok, et al., "Monolithic Instrumentation Amplifier", *Electrical Engring*, vol. 3, N. 3, Jul. 1978, pp. 225-236.

Primary Examiner—James B. Mullins
Assistant Examiner—Steven J. Mottola
Attorney, Agent, or Firm—George T. Noe

[57] ABSTRACT

A high-frequency differential amplifier is provided with a pair of buffer input stages, each having transistors the transconductance of which may be varied by varying a current source connected thereto. Since transistor frequency response and step response are dependent upon transconductance, bandwidth and damping factor of the step response may be varied for optimum performance without degrading gain and dynamic range characteristic of the differential amplifier. One useful application of the differential amplifier of the present invention is as an error amplifier in a cascomp amplifier circuit, such that the apparent damping factor of the step response of the cascomp circuit may be adjusted.

5 Claims, 2 Drawing Figures

HIGH FREQUENCY DIFFERENTIAL AMPLIFIER WITH ADJUSTABLE DAMPING FACTOR

BACKGROUND OF THE INVENTION

The present invention relates to differential amplifiers in general, and in particular to a differential amplifier with active transient response correction.

In high-frequency amplifiers, it is generally desirable to have a means by which the transient response of an individual stage can be varied, primarily to compensate for variations in the active devices which occur during the manufacturing process. Typically, transient-response adjustments (also known as high-frequency compensation or signal peaking) are made by varying the values of reactive passive elements such as capacitors or inductors in the signal path. The conventional transient-response adjustment method is found to be lacking in several respects. First, reactive components (or the tools used to adjust them) often introduce parasitic reactances into the circuit which compromise performance. Second, with the advent of micro-miniaturization of amplifiers in the form of integrated circuits, the sensitive circuit nodes which require adjustment are often inaccessible. Third, reactive passive elements are often expensive, and the costs are cumulative where several amplifier stages are required. Finally, the conventional methods for transient-response adjustments do not lend themselves to automatic or programmable control, or to cases in which functional control of transient response is desirable, e.g., such as with temperature or signal strength.

SUMMARY OF THE INVENTION

In accordance with the present invention, a high-frequency differential amplifier comprising an emitter-coupled pair of transistors has a buffer stage connected to each side of the differential amplifier in such a way that each buffer stage provides an input path as well as a feedback path for the respective sides. Each buffer stage comprises an emitter-coupled pair of transistors in which the standing currents are equally balanced (although this is not critical), and the base-emitter junction of the transistor on each respective side of the differential amplifier is coupled across the collector-to-base junction of one of the transistors of the emitter-coupled pairs of the respective buffer stage. In operation, an input signal is transmitted across the bases of the buffer stage emitter-coupled pairs of transistors and appears at the emitters of the differential amplifier transistors. Because the transconductance (gm) is proportional to the collector current ($I_c$) of a transistor, the transconductance may be varied by varying the standing current therethrough. Exploiting this phenomena, the standing current for each of the emitter-coupled pairs of transistors is provided by a variable current source. And because the frequency response of transistor is related to gm (and the damping factor related to 1/gm), the bandwidth and step response of the emitter-coupled pair may be adjusted by varying the current through the devices. Furthermore, this adjustment may be made with little, if any, affect on the gain and dynamic range of the differential amplifier, so that those parameters remain nearly constant.

Among many useful applications for the differential amplifier of the present invention is its use as an error amplifier in a cascode feed-forward amplifier, which is known in the industry as the "cascomp" amplifier as taught by Patrick A. Quinn in U.S. Pat. No. 4,146,844. Here, the apparent damping factor of the cascomp amplifier amplifier circuit may be adjusted by varying a single DC bias control which varies simultaneously a pair of current sources for the two respective buffer stages for the error amplifier.

It is therefore one object of the present invention to provide a high frequency differential amplifier with adjustable bandwidth and step response while gain and dynamic range remain nearly constant.

It is another object of the present invention to provide a differential amplifier having a pair of buffer input stages in which the damping factor of the step response may be adjusted by varying a DC bias current.

It is an additional object of the present invention to provide a buffered error amplifier for a cascomp amplifier circuit such that the apparent damping factor of the step response of the cascomp circuit can be adjusted by application thereto of an external control DC voltage.

Other objects, features, and advantages of the present invention will become apparent to those having ordinary skill in the art upon a reading of the following detailed description when taken in conjunction with the accompanying drawings.

DRAWINGS

FIG. 1 shows a buffered differential amplifier having adjustable damping factor of the step response in accordance with the present invention; and FIG. 2 shows a practical embodiment of the present invention in a cascomp amplifier circuit.

DETAILED DESCRIPTION OF THE INVENTION

Figures 1, 2:
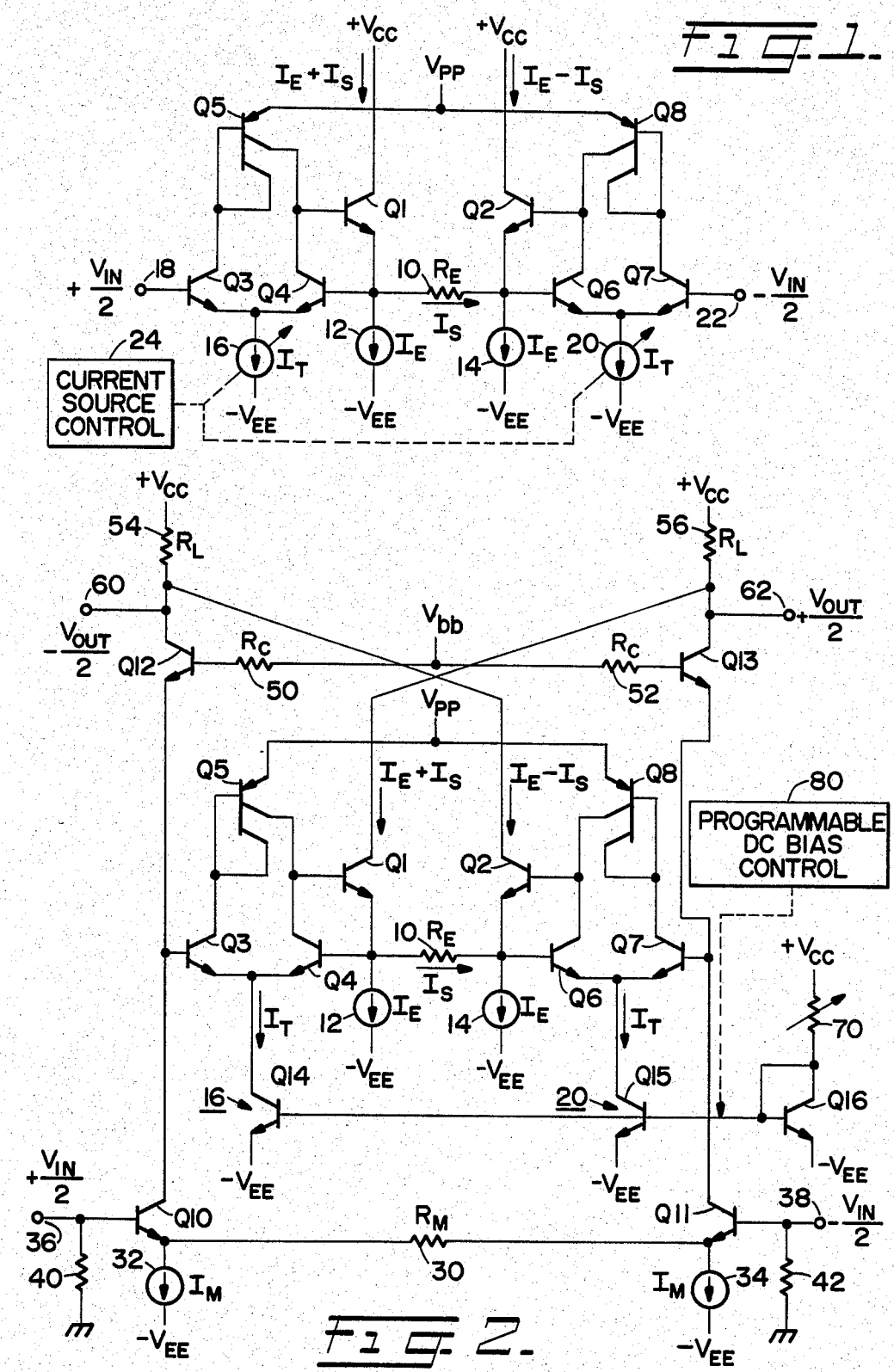

Referring to FIG. 1 of the drawings, there is shown a differential amplifier comprising transistors Q1 and Q2, the emitters of which are coupled together by a signal-current-developing resistor 10. The emitter of transistor Q1 is coupled to a suitable negative supply voltage $-V_{EE}$ via a constant current sink 12, which produces a standing current $I_E$ for transistor Q1. Likewise, the emitter of transistor Q2 is coupled to the supply voltage $-V_{EE}$ via a constant current sink 14, which produces a standing current $I_E$ for transistor Q2. The collectors of Q1 and Q2 are shown connected to a suitable positive supply voltage $+V_{cc}$, and since a signal current $I_s$ is developed across resistor 10 having a value $R_E$, the collector current of transistor Q1 is $I_E+I_s$ and the collector current of transistor Q2 is $I_E-I_s$. This is based on the assumption, of course, that transistors Q1 and Q2 have high beta characteristics so that base current is negligible and nearly all of the emitter current $I_E$ is conducted as collector current as well. As a practical matter, however, there will be a finite amount of base current in these devices, but for an understanding of the present invention, the ideal case is presented for simplicity.

A buffer stage on the Q1 side (left-hand side) of the differential amplifier comprises transistors Q3 and Q4, the emitters of which are connected together and coupled to the negative supply $-V_{EE}$ via a current sink 16. The base of transistor Q3 is connected to an input terminal 18, while the base of transistor Q4 is connected to the emitter of differential amplifier transistor Q1. Note also that the base of transistor Q1 is connected to the collector of transistor Q4. A double-collector current-mirror transistor Q5 has the base and one collector thereof connected to the collector of transistor Q3, while the other collector thereof is connected to the collector of transistor Q4 and to the base of transistor Q1. The emitter of transistor Q5 is coupled to a suitable bias voltage $V_{pp}$. The purpose of current-mirror transistor Q5 is to split the current $I_T$ produced by current sink 16 equally between transistors Q3 and Q4, although a current imbalance will not destroy operation of the buffer stage. It should be pointed out that there are many ways in which the load rquirements of transistors Q3 and Q4 may be achieved; the current mirror technique is appropriate for this design.

A substantially idential buffer stage on the Q2 side (right-hand side) of the differential amplifier comprises emitter-coupled transistors Q6 and Q7, current sink 20, input terminal 22, and double-collector current-mirror transistor Q8. Here again, the current-mirror transistor Q8 splits the current $I_T$ produced by current sink 20 equally between transistors Q6 and Q7.

In operation, input signals $+V_{IN}/2$ and $-V_{IN}/2$ applied to input terminals 18 and 22, respectively, are transmitted to the bases of transistors Q4 and Q6, respectively, and hence the signal $V_{IN}$ is developed across resistor 10 to produce the signal current $I_s$. The signals + and $-V_{IN}/2$ are replicated at the bases of Q4 and Q6, respectively, due to the wqual standing currents in transistors Q3–Q4 and Q6–Q7, the negative feedback action of transistors Q1 and Q2 emitters on transistors Q4 and Q6 bases, respectively, and the high open loop voltage gain from the base of transistor Q3 to the base of transistor Q1, and from the base of transistor Q7 to the base of transistor Q2. Accordingly, again assuming the gigh beta factors of transistors Q1 and Q2, the value of signal current $I_s$ is equal to $V_{IN}/R_E$.

The transconductance (gm) of the transistor is $gm \approx I_c/V_T$, where $I_c$ is the collector current and $V_T$ is the well-known voltage equivalent of temperature whereby $V_T = kT/q$, k being the Boltzmann constant in joules per degree Kelvin, T being the temperature in degrees Kelvin, and q being the magnitude of charge on an electron. While not derived mathematically here because it is shown in many textbooks, frequency response of the transistor is proportional to the transconductance gm. The open loop voltage gain of the feedback triple Q1–Q3–Q4 is proportional to the gm of Q3 and Q4. Therefore, the colosed-loop frequency response changes as the gm is varied. Furthermore, since this adjustment is made in the buffer stage transistors, little, if any, affect is made on the gain and dynamic range of the differential amplifier (transistors Q1 and Q2), so that these parameters remain nearly constant. To this end, current sinks 16 and 20 are shown to be variable current sources, adjustment of which adjusts the bandwidth and step response of transistors Q3–Q4 and transistors Q6–Q7 for optimum performance. It should be pointed out that current sinks 16 and 20 could be adjusted separately; however, if transistors Q3, Q4, Q6 and Q7 are substantially identical, such as may be attained by integrated circuit processes, current sinks 16 and 20 may be adjusted by a single current-source control 27 as shown. There are many ways in which this current-source control may be implemented, such as an adjustable DC bias control or even programmable DC voltages provided by computer control.

FIG. 2 shows a practical implementation of the high-frequency differential amplifier of the present invention in a cascode feed-forward (cascomp) amplifier wherein reference numerals of FIG. 1 are retained. The cascomp amplifier comprises main-channel differential amplifier transistors Q10 and Q11, the emitters of which are coupled together through a signal-current developing resistor 30. Current sinks 32 and 34 provide main-channel standing current $I_M$. Input signals are applied between input terminals 36 and 38, and resistors 40 and 42 are suitable bias resistors. The cascode feature is provided by common-base amplifier transistors Q12 and Q13, the emitters of which are connected respectively to the collectors of transistors Q10 and Q11. Resistors 50 and 52 having a value $R_C$ are connected between the bases of transistors Q12 and Q13 to produce an error signal which results in correcting alpha-induced error. The collectors of transistors Q12 and Q13 are connected via suitable load resistors 54 and 56, respectively, to the positive voltage supply. Output terminals 60 and 62 are connected respectively to the collectors of transistors Q12 and Q13. The error amplifier is connected such that the inputs are connected across the collectors of transistors Q10 and Q11 and the outputs are cross-coupled to the collectors of transistors Q12 and Q13. Cascomp amplifiers of this type are fully described in U.S. Pat. No. 4,146,844 to Patrick A. Quinn and U.S. Pat. No. 4,322,688 to Kenneth G. Schlotzhauer et al.

Current sinks 16 and 20 are herein shown as transistors Q14 and Q15, the bases of which are connected together and to the base of a diode-connected (collector to base) trnsistor Q16. A variabele resistor 70 such as a potentiometer is connected between the collector of transistor 16 and supply voltage $+V_{cc}$ to adjust the DC bias of transistors Q14 and Q16, and hence to adjust the currents $I_T$ for transistors Q3, Q4, Q6 and Q7, which are assumed to be substantially identical. Also shown indirectly connected by a dashed line to the bases of transistors Q14 and Q15 is a programmable DC bias control circuit 80, which may be a suitable computer-controlled device for providing DC bias voltages for adjustment of the currents $I_T$ produced by current-sink transistors Q14 and Q15. This to indicate that as an alternative to bias control potentiometer 70, the bias control voltages may be programmed or provided under computer control.

It should be noted that for best performance, the error amplifier should be an ideal transconductance amplifier. The configuration provided here approaches that ideal in that the feedback provided by the emitter-to-base connections of transistors Q1 and Q2 yields high linearity and low thermal distortion, while the buffering action of transistors Q3–Q4 and Q6–Q7 requires low input bias current so that the beta loading of transistors Q12 and Q13 is low and error cancellation improves.

In practice, the error signal appearing at the emitters of transistors Q12 and Q13 is peaked at high frequencies by resistors 50 and 52 and parasitic inductance in the bases of transistors Q12 and Q13. Therefore, the error signal at high frequencies is larger than necessary to correct for gm and alpha losses. By varying the buffer stage currents $I_T$, the bandwidth of the error amplifier may be adjusted to pass the desired amount of high frequency correction to the output. This results in an apparent variation in the damping factor of the transient response of the cascomp amplifier circuit.

While I have shown and described a preferred embodiment of my invention, it will be apparent to those skilled in the art that many changes may be made without departing from my invention in its broader aspects. The appended claims therefore cover all such changes and modifications as fall therewithin.

I claim as being novel is:

1. A high-frequency differential amplifier, comprising:
   an emitter-coupled pair of transistors, each having a collector, a base, and an emitter;
   a signal-current-developing resistor connected between the emitters of said pair of transistors;
   means for biasing each of said transitors;
   an input buffer stage connected to each of said transistors, each of said buffer stages having the transconductance characteristic of a transistor; and
   a pair of variable current sources for providing a variable operating current to each of said buffer stages thereby to vary the transconductance of each buffer stage without substantially affecting the operation of said emitter-coupled pair of transistors.

2. A differential amplifier in accordance with claim 1 wherein each of said buffer stages comprises a pair of transistors, the emitters of which are connected together, wherein the base of one of said pair of buffer stage transistors is connected to an input terminal and the collector and base of the other of said pair of buffer stage transistors are connected respectively to the base and emitter of a respective one of said differential amplifier transistors, said buffer stage further comprising means for setting the quiescent current conduction of said pair of buffer stage transistors.

3. A differential amplifier in accordance with claim 2 wherein said current-setting means comprises a current mirror circuit for each buffer stage, each of said current mirror circuits having a pair of current nodes which provide equal currents, one of each of said current nodes connected to a respective collector of said pair of buffer stage transistors.

4. A differential amplifier stage in accordance with claim 1 further comprising means for varying said variable current sources simultaneously.

5. A differential amplifier in accordance with claim 1 wherein said variable current sources are programmable.

* * * * *

UNITED STATES PATENT AND TRADEMARK OFFICE
CERTIFICATE OF CORRECTION

PATENT NO. : 4,528,515
DATED : July 9, 1985
INVENTOR(S) : Winthrop A. Gross

It is certified that error appears in the above—identified patent and that said Letters Patent is hereby corrected as shown below:

Column 2, line 21, reads "ordingary" should be --ordinary--.

Column 3, line 25, reads "wqual" should be --equal--.

Column 3, line 33, reads "gigh" should be --high--.

Column 3, line 46, reads "colosed-loop" should be --closed-loop--.

Column 3, line 61, reads "27" should be --24--.

Column 4, line 28, reads "trnsistor" should be --transistor--.

Column 4, line 28, reads "variabele" should be --variable--.

Signed and Sealed this

Twenty-ninth Day of July 1986

[SEAL]

Attest:

DONALD J. QUIGG

Attesting Officer

Commissioner of Patents and Trademarks